United States Patent
Chen et al.

(10) Patent No.: US 8,571,152 B1
(45) Date of Patent: Oct. 29, 2013

(54) POWER-SAVING APPARATUS USED FOR WIRELESS COMMUNICATION RECEIVER AND SYSTEM, AND METHOD USING THE SAME

(75) Inventors: Jeng-Hong Chen, Temple City, CA (US); Chin-Chang Chang, Irvine, CA (US); Kuang-Hu Huang, HsinChu (TW); Chih-Ching Huang, Hsinchu (TW); Che-Kang Sun, Hsinchu (TW); Chun-Yuan Huang, Hsinchu (TW)

(73) Assignee: ISSC Technologies Corp., Hsinchu (TW)

( * ) Notice: Subject to any disclaimer, the term of this patent is extended or adjusted under 35 U.S.C. 154(b) by 0 days.

(21) Appl. No.: 13/477,390

(22) Filed: May 22, 2012

(51) Int. Cl.
*H04L 27/06* (2006.01)

(52) U.S. Cl.
USPC ........... 375/345; 375/347; 375/350; 375/324; 341/155; 455/136; 455/134; 455/138; 455/226.2; 455/234.2; 455/245.2; 455/250.1; 455/311; 455/341; 455/240.1; 455/324; 455/232.1

(58) Field of Classification Search
USPC ........ 455/136, 134, 138, 226.2, 234.2, 245.2, 455/250.1, 311, 341, 240.1, 324, 232.1; 375/345, 347, 350, 324; 341/155
See application file for complete search history.

(56) References Cited

U.S. PATENT DOCUMENTS

| 6,864,817 | B1 | 3/2005 | Salvi et al. |
| 7,212,795 | B2 | 5/2007 | Liu et al. |
| 7,689,217 | B2 | 3/2010 | Ruelke et al. |
| 7,936,850 | B2 | 5/2011 | Rodal et al. |
| 8,249,535 | B2 * | 8/2012 | Ridgers et al. ................ 455/230 |
| 2006/0002495 | A1 * | 1/2006 | Shirakawa et al. ........... 375/345 |

* cited by examiner

*Primary Examiner* — Daniel Washburn
*Assistant Examiner* — Rahel Guarino
(74) *Attorney, Agent, or Firm* — Birch, Stewart, Kolasch & Birch, LLP

(57) ABSTRACT

The present invention discloses an apparatus and method for power-saving switch on a pair of configurable analog-to-digital converters. The apparatus mainly comprises an antenna, an antenna switch, a zero-IF RF receiver, and a baseband demodulator. By using a first and a second control signal to control the ON/OFF states of a plurality of switches and a plurality of stage units in the configurable analog-to-digital converters, and the third control signal to control the ON/OFF states of a plurality of LNA stages and the gain of a plurality VGAs, the power saving of the analog-to-digital converter is easily achieved.

11 Claims, 5 Drawing Sheets

POWER-SAVING APPARATUS USED FOR WIRELESS COMMUNICATION RECEIVER AND SYSTEM, AND METHOD USING THE SAME

BACKGROUND OF THE INVENTION

1. Field of the Invention

The present invention relates to power-saving apparatus used for wireless communication systems, such as but not limited to wireless local area networks (WLAN), and in particular to a power-saving apparatus having a configurable analog-to-digital converter (ADC) whose output bits can be reduced for power-saving purposes.

2. Background

In wireless local area networks (WLAN) applications, the received signal strength can vary with a dynamic range up to 100 dB depending on the distance between a transmitter and a receiver. An Automatic Gain Control (AGC) circuitry has been widely used in WLAN receivers to optimize its range performance. Typically a pair of 8-10 bit analog-to-digital converters are implemented to have the required resolution to decode the highest data rate, which has the largest peak-to-average-ratio (PAR), in the presence of severe multipath and/or adjacent channel interference from other WLAN or Bluetooth users nearby. However, this worst-case-scenario design costs the hardware to consume more power than required in practical operations. For example, if an 802.11 receiver is in close vicinity to an 802.11 access-point, a pair of ADC's each with a smaller number of bits will be sufficient to achieve the same level of system performance. In this case, the ADC power saving can be significant. As an example, one can easily achieve a 20% or more ADC power-saving if a 10-bit pipelined ADC design can be configured as an 8-bit ADC on a per packet basis. While first implemented in the early 2000's, a typical WLAN transceiver consists of three chips, one power amplifier (PA) chip, one RF transceiver chip, and one integrated base-band (BB) and Medium Access Control (MAC) chip. To further lower down the total cost of a WLAN transceiver, integration of the PA function into the RF transceiver chip has been achieved. Lately, a single-chip WLAN transceiver implementation has really become popular, although some still prefer to use an external PA. FIG. 1 shows a functional block diagram for a wireless transceiver, which includes a direct-conversion (also known as zero-IF) receiver, for WLAN applications. At the highest level, it contains four functional blocks: an antenna 11, an antenna switch 12, a transmitter 20 and a receiver 10.

A detailed functional block diagram for the receiver 10 is also shown in FIG. 1. The receiver 10 contains two major functional blocks: a RF receiver 30 and a base-band demodulator 40. As is shown in FIG. 1, a typical RF receiver 30 consists of a first stage of low noise amplifier (LNA) 13a and a second stage of LNA 13b, a pair of mixers 14a and 14b, a pair of channel selection filters 17a and 17b, and a pair of multiple stages of Variable Gain Amplifiers (VGA's) 18a and 18b.

The first stage of LNA 13a and the second stage of LNA 13b are used to amplify a weak received signal with minimum distortion. In other words, the first stage of LNA 13a and the second stage of LNA 13b are used to enhance the sensitivity of the receiver. To provide the best sensitivity, an LNA stage typically provides a gain over 15 dB and a Noise Figure (NF) between 1.5 to 2.5 dB.

In the presence of a very strong signal, it is usually desirable to turn off some or all LNA stages if multiple LNA stages are used. The output of the first stage of LNA 13a and the second stage of LNA 13b is connected to a pair of mixers 14a and 14b. To keep the fidelity of the received signal in a direct-conversion receiver, two mixers are required to provide an in-phase and a quadrature phase base-band signals. One mixer 14a takes the carrier generated by the synthesizer 16 as one input and the output of the second stage LNA 13b as another input to convert the received Radio Frequency (RF) signal to a base-band In-phase signal (also known as I-channel) as its output. The other mixer 14b uses a 90-degree phase-shifted carrier 15 as one input and the output of the second stage of LNA 13b as another input to convert the received RF signal to a baseband Quadrature-phase signal (also known as Q-channel) as its output. In what follows, the received in-phase and quadrature signals will be referred as I-channel and Q-channel signals, respectively. From now on, the processing of both I-channel and Q-channel signals is essentially the same. So it is sufficient to describe the processing of the I-channel signal.

For the I-channel signal, a low-pass filter 17a is applied to the corresponding mixer output to filter out the adjacent channel interferences and the unwanted mixer output at twice the received RF signal frequency. The I-channel filter 17a output is connected to the variable gain amplifiers (VGA) 18a for gain adjustment. In this diagram, each VGA 18a contains two Variable Gain Amplifier stages 19a and 19b with their gain controlled by the AGC control signals (as shown in FIG. 1) generated by AGC 22. As its name shows, each VGA stage 19a or 19b allows one to adjust its control voltage for providing variable gain to its input signal. Typically, a VGA stage has a dynamic range of 20 to 30 dB with a gain adjustment step of 1 or 2 dB. To achieve a wider receiver dynamic range, 3 or more VGA stages may be implemented. The output of the VGA 18a is connected to an analog to digital converter (ADC) 21a of the base-band demodulator 40. The ADC 21a digitizes and coverts its input signal to the digitized I-channel samples for further processing of the received signal by the base-band demodulator processor 23 in digital domain. Detail operations will be presented later.

To fully utilize the dynamic range of an ADC, the input to an ADC needs to be maintained at or close to an optimal level. This is achieved by the receive signal strength indicator (RSSI) measurement and automatic gain control (AGC) 22 circuitry. The RSSI measurement and AGC 22 circuitry, most commonly implemented in the base-band demodulator receiver 40, estimates the received signal strength $P_R$ based on the digitized I and Q samples, and then generates VGA and LNA control signals as its outputs, with a VGA control signal for VGA 18a/18b gain setting and an LNA control signal for the ON/OFF states control of the first stage of LNA 13a and the second stage of LNA 13b.

It was mentioned above that it is usually desirable to turn off some or all stages of the LNA's if multiple LNA stages are used in the presence of a very strong signal. The AGC function above serves to generate control signals for LNA stages ON/OFF states and VGA's gain setting, based on the estimated receive signal power, $P_R$. Typically, it takes a small amount of time, $T_{LNA}$ to completely switch on or off an LNA stage. During this time period, the AGC block usually stops estimating the received signal power until the LNA stage on/off switch has been completed. Therefore, if an ADC circuitry can be designed to simultaneously switch part of its circuitry off while an LNA stage is being switch off, and vice versa, then one can have an ADC with adaptive output bits to properly save the ADC operating power. The crux resides in the fact that the ADC switch time, $T_{ADC}$, is usually smaller than the LNA switching time, $T_{LNA}$. In this case, both the LNA switch and ADC switch can be accomplished without slowing down the operation of AGC. Otherwise, the AGC function could be stopped for a little longer time equal to $T_{ADC}$, greater than $T_{LNA}$ when a LNA is switched off. This is not desirable since the whole AGC process must be done within a very limited time in the beginning of a packet to tackle a possible 100 dB dynamic received-power range.

In FIG. 2, a functional block diagram for a traditional 10-bit pipelined ADC implementation 3 is shown. One can consider that there is an N=10 pipelined ADC implementation for N-bit ADC 21a or 21b in FIG. 1. This specific implementation has 5 Stages 31-35. With each Stage 31-35 serving to output 2 bits, an analog input signal is digitalized to a 10-bit output sample: ($b_9$, $b_8$, $b_7$, $b_6$, $b_5$, $b_4$, $b_3$, $b_2$, $b_1$, $b_0$), with $b_9$ being the most significant bit, and $b_0$ being the least significant bit.

U.S. Pat. No. 7,212,795, issued to Der-Zheng Liu et al. entitled "Automatic gain control and antenna selection method for a radio communication system" discloses an automatic gain control and antenna selection method used in a receiver of a radio communication system. This patent application is focused on the received signal power is estimated by digital signal processing after analog-to-digital conversion in the system, in order to adjust the gain of the front end analog signal until the magnitude of the analog signal is adjusted to an optimum range of the digital signal processing. In addition, the ADC is utilized to estimate the signal power as the basis of the antenna selection.

However, the above disclosure does not effectively control the N-bit ADCs in the baseband demodulator, which can not save the power significantly. According to the above discussions, it need a method and apparatus to overcome the disadvantage of the prior art.

BRIEF SUMMARY OF THE INVENTION

It is an objective of the present invention to provide an apparatus and method for power-saving switch on analog-to-digital converter. By the first and the second control signal to control the ON/OFF states of a plurality of switches and a plurality of stage units, the third control signal to control the ON/OFF states of a LNA with a plurality of stages and the gain of a first plurality VGAs and a second plurality VGAs, the power saving of analog-to-digital converter is easily achieved.

It is another objective of the present invention to provide a power-saving apparatus used for a wireless communication baseband demodulator.

It is another objective of the present invention to provide a power-saving transceiver used for wireless communication system.

It is another objective of the present invention to provide a method used for saving power in the wireless communication receiver.

To achieve the above objective, the present invention provides a power-saving apparatus used for a wireless communication baseband demodulator, comprising: a first configurable N-bit ADC, a second configurable N-bit ADC, a receive signal strength indicator (RSSI) and automatic gain control (AGC) unit, a baseband demodulator processor. The first configurable N-bit ADC is used for providing a first N-bit signal according to a first signal and a first control signal. The second configurable N-bit ADC is used for providing a second N-bit signal according to a second signal and a second control signal. The receive signal strength indicator (RSSI) and automatic gain control (AGC) unit, which is electrically connected to the first configurable N-bit ADC and the second configurable N-bit ADC, is used for providing the first control signal, the second control signal and a third control signal according to the estimated received signal strength ($P_R$). The baseband demodulator processor, which is electrically connected to the first configurable N-bit ADC and the second configurable N-bit ADC, is used for processing the first N-bit signal and the second N-bit signal and outputting a demodulated signal.

According to one aspect of the present invention, the first configurable N-bit ADC further comprises: a first plurality of pipelined stage units and a first plurality of switches. The first plurality of pipelined stage units, which have a signal input terminal, a control signal input terminal and a plurality of output terminals, are used for providing the first N-bit signal according to the first signal and the first control signal. The first plurality of switches, which are electrically connected to the first plurality of pipelined stage units, are used for providing a plurality of bypass-paths for the first plurality of pipelined stage units, wherein each of the first plurality of switches are connected in parallel to each of the first plurality of pipelined stage units.

According to one aspect of the present invention, the second configurable N-bit ADC further comprises: a second plurality of pipelined stage units and a second plurality of switches. The second plurality of pipelined stage units, which have a signal input terminal, a control signal input terminal and a plurality of output terminal, are used for providing the second N-bit signal according to the second signal and the second control signal. The second plurality of switches electrically connected to the second plurality of pipelined stage units are used for providing a plurality of bypass-paths for the second plurality of pipelined stage units, wherein each of the second plurality of switches are connected in parallel to each of the second plurality of pipelined stage units.

To achieve another objective, the present invention provides a power-saving transceiver used for wireless communication system, comprising: an antenna, an antenna switch, a transmitter, a zero-IF RF receiver, and a baseband demodulator. The antenna is used for receiving and transmitting a RF signal. The antenna switch is electrically connected to the antenna. The transmitter is electrically connected to the antenna switch. The zero-IF RF receiver, which is electrically connected to the antenna switch, is used for providing a first signal and a second signal according to a received RF signal. The baseband demodulator, which is electrically connected to the zero-IF RF receiver, is used for providing a third control signal to the zero-IF RF receiver and a demodulated signal according to the first signal and the second signal, wherein the baseband demodulator comprises: a first configurable N-bit ADC, a second configurable N-bit ADC, a receive signal strength indicator (RSSI) and automatic gain control (AGC) unit, a baseband demodulator processor. The first configurable N-bit ADC is used for providing a first N-bit signal according to a first signal and a first control signal. The second configurable N-bit ADC is used for providing a second N-bit signal according to a second signal and a second control signal. The receive signal strength indicator (RSSI) and automatic gain control (AGC) unit, which is electrically connected to the first configurable N-bit ADC and the second configurable N-bit ADC, is used for providing the first control signal, the second control signal and a third control signal according to an estimated received signal strength ($P_R$). The baseband demodulator processor, which is electrically connected to the first configurable N-bit ADC and the second configurable N-bit ADC, is used for processing the first N-bit signal and the second N-bit signal and outputting a demodulated signal.

According to one aspect of the present invention, the first configurable N-bit ADC further comprises: a first plurality of pipelined stage units, a first plurality of switches. The first plurality of pipelined stage units are used for providing the first N-bit signal according to the first signal and the first control signal. The first plurality of switches, which are electrically connected to the first plurality of pipelined stage units, is used for providing a plurality of bypass-paths for the first plurality of pipelined stage units, wherein each of the first plurality of switches are connected in parallel to each of the first plurality of pipelined stage units.

According to one aspect of the present invention, the second configurable N-bit ADC further comprises: a second plurality of pipelined stage units, a second plurality of switches. The second plurality of pipelined stage units are used for providing the second N-bit signal according to the second signal and the second control signal. The second plurality of switches, which are electrically connected to the second plurality of pipelined stage units, are used for providing a plurality of bypass-paths for the second plurality of pipelined stage units, wherein each of the second plurality of switches are connected in parallel to each of the second plurality of pipelined stage units.

According to one aspect of the present invention, the zero-IF RF receiver further comprises: a first stage of low noise amplifiers (LNA), a second stage of low noise amplifiers (LNA), a first plurality of variable gain amplifiers (VGAs), a second plurality of variable gain amplifiers (VGAs). The first stage of low noise amplifiers (LNA), which are electrically connected to the antenna switch, is used for amplifying the received RF signal. The second stage of low noise amplifiers (LNA), electrically connected to the first stage of low noise amplifiers (LNA), is used for amplifying the received RF signal. The first plurality of variable gain amplifiers (VGAs), which are electrically connected to the second stage of low noise amplifiers (LNA) through a first mixer and a first filter, are used for providing a variable gain to a I-channel signal. The second plurality of variable gain amplifiers (VGAs), which are electrically connected to the second stage of low noise amplifiers (LNA) through a second mixer and a second filter, are used for providing a variable gain to a Q-channel signal, wherein the third control signal consist of the ON/OFF states of the first and the second stage of low noise amplifiers (LNA), the variable gain values of the first plurality of variable gain amplifiers (VGAs) and the second plurality of variable gain amplifiers (VGAs), with each of the first plurality of variable gain amplifiers (VGAs) and the second plurality of variable gain amplifiers (VGAs) containing a plurality of stages, respectively.

To achieve another objective, the present invention provides a method used saving power in the wireless communication receiver, comprising steps of: receiving a received RF signal from an antenna using a zero-IF RF receiver according to the antenna switch, estimating an estimated received signal strength by using a receive signal strength indicator (RSSI) and automatic gain control (AGC) unit located in a baseband modulator, comparing the estimated received signal strength ($P_R$) with a receive signal strength indicator thresholds value ($RSSI_{TH}$) to generate a first control signal and a second control signal, providing a third control signal based on the estimated received signal strength ($P_R$), with the first control signal to control a first configurable N-bit ADC in a baseband modulator and the second control signal to control a second configurable N-bit ADC in the baseband modulator, and the third control signals consisting of the ON/OFF states of a first stage of low noise amplifiers (LNA) and a second stage of low noise amplifiers (LNA), a gain of a first plurality of variable gain amplifiers (VGAs) and a gain of a second plurality of variable gain amplifiers (VGAs).

These and many other advantages and features of the present invention will be readily apparent to those skilled in the art from the following drawings and detailed descriptions.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

Figure 3:
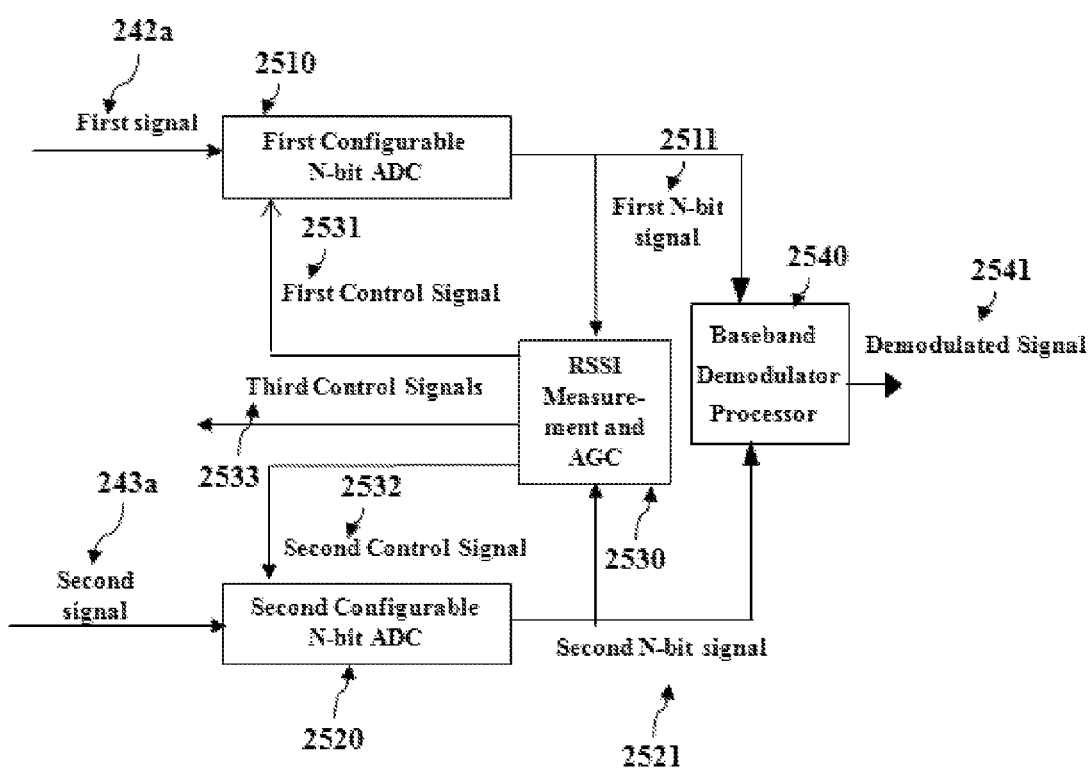
FIG. 3 shows a functional block diagram for a baseband demodulator of the present invention.

To understand the spirit of the present invention, FIG. 3 shows a functional block diagram for a baseband demodulator 250 of the present invention, wherein the baseband demodulator 250 comprises: a first configurable N-bit ADC 2510, a second configurable N-bit ADC 2520, a receive signal strength indicator (RSSI) and automatic gain control (AGC) unit 2530, a baseband demodulator processor 2540. The first configurable N-bit ADC 2510 is used for providing a first N-bit signal 2511 according to a first signal 242a and a first control signal 2531. The second configurable N-bit ADC 2520 is used for providing a second N-bit signal 2521 according to a second signal 243a and a second control signal 2532. The receive signal strength indicator (RSSI) and automatic gain control (AGC) unit 2530, which is electrically connected to the first configurable N-bit ADC 2510 and the second configurable N-bit ADC 2520, is used for providing the first control signal 2531, the second control signal 2532 and a third control signal 2533 according to an estimated received signal strength ($P_R$). The baseband demodulator processor 2540, which is electrically connected to the first configurable N-bit ADC 2510 and the second configurable N-bit ADC 2520, is used for processing the first N-bit signal 2511 and the second N-bit signal 2522 and outputting a demodulated signal 2541. Compared to FIG. 1 of the prior art, the two N-bit ADC's 2510 and 2520 are now configurable with the RSSI measurement and AGC unit 2530 generating two additional control signals: a first control signal 2531 and a second control signal 2532 to properly configure the two configurable N-bit ADC's 2510 and 2520. A third control signal 2533, which is also generated by the RSSI measurement and AGC unit 2530, is the same as the VGA/LNA control signals in FIG. 1.

Figure 4A:
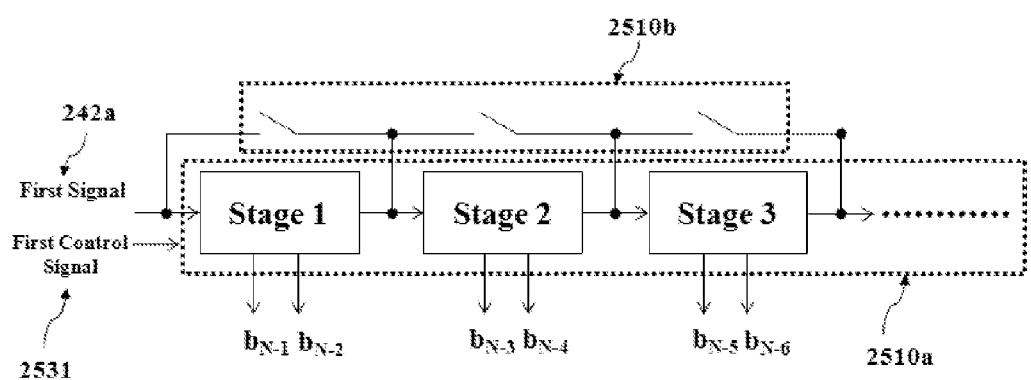
FIG. 4 shows a functional block diagram for a first configurable N-bit ADC and a second configurable N-bit ADC of the present invention.

FIG. 4a shows a functional block diagram for a first configurable N-bit ADC of the present invention. The first configurable N-bit ADC 2510 further comprises: a first plurality of pipelined stage units 2510a, a first plurality of switches 2510b. The first plurality of pipelined stage units 2510a, having a signal input terminal for receiving the first signal 242a, a control signal input terminal for receiving the first control signal 2531 and a plurality of output terminals for providing the first N-bit (or less bit) output according to the first signal 242a and the first control signal 2531. The first plurality of switches 2510b, which are electrically connected to the first plurality of pipelined stage units, are used for providing a plurality of bypass-paths for the first plurality of pipelined stage units 2510a, wherein each of the first plurality of switches 2510b are connected in parallel to each of the first plurality of pipelined stage units 2510a.

Figure 4B:
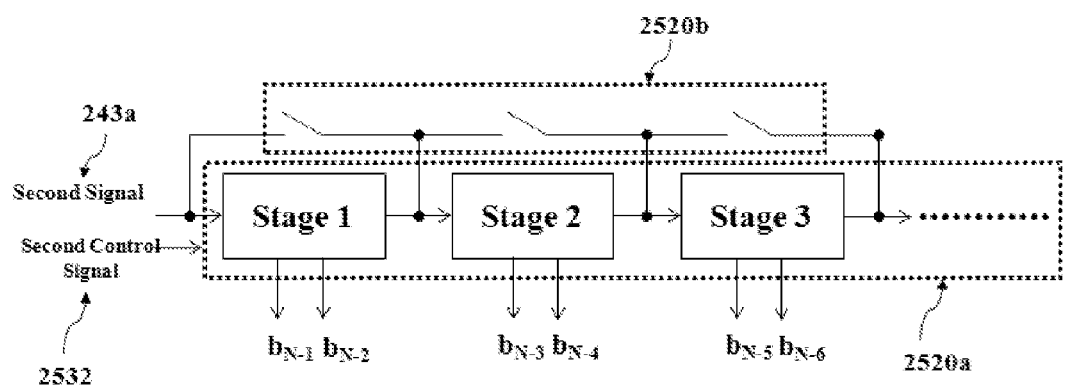

FIG. 4b shows a functional block diagram for a second configurable N-bit ADC of the present invention. The second configurable N-bit ADC 2520 further comprises: a second plurality of pipelined stage units 2520a, a second plurality of switches 2520b. The second plurality of pipelined stage units 2520a, having a signal input terminal for receiving the second signal, a control signal input terminal for receiving the second control signal 2532 and a plurality of output terminals, are used for providing the second N-bit (or less bits) output according to the second signal 243a and the second control signal 2532. The second plurality of switches 2520b, which are electrically connected to the second plurality of pipelined stage units 2520a, are used for providing a plurality of bypass-paths for the second plurality of pipelined stage units 2520a, wherein each of the second plurality of switches 2520b are connected in parallel to each of the second plurality of pipelined stage units 2520a.

Figure 5:
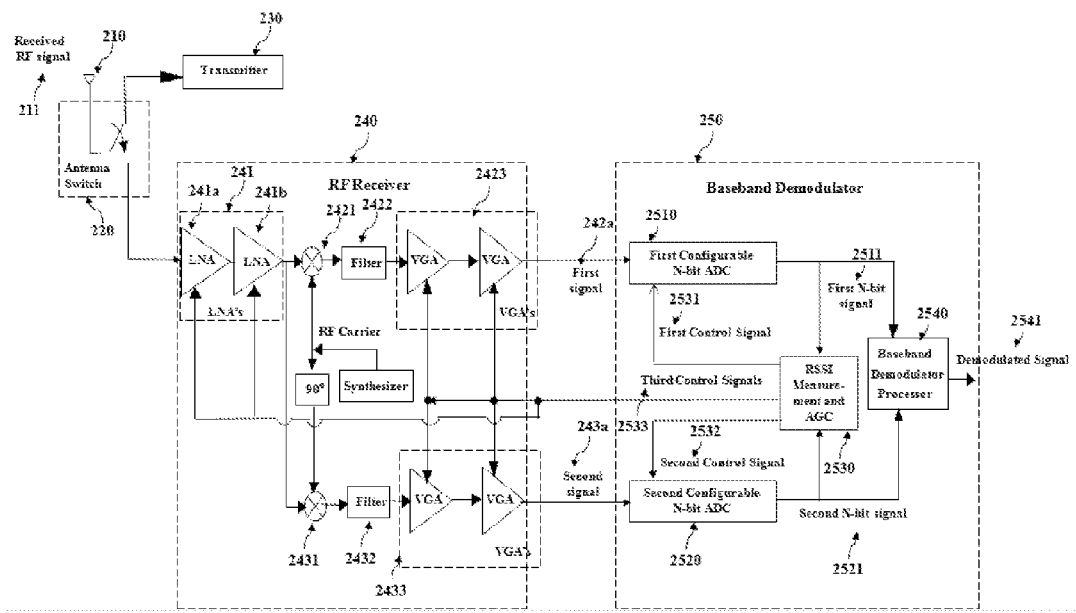
FIG. 5 shows a functional block diagram for a wireless transceiver with configurable ADC of the present invention.

FIG. 5 shows a functional block diagram for a wireless transceiver with configurable ADC of the present invention, comprising: an antenna 210, an antenna switch 220, a transmitter 230, a zero-IF RF receiver 240, a baseband demodulator 250. The antenna 210 is used for receiving and transmitting a RF signal. The antenna switch 220 is electrically connected to the antenna 210. This wireless transceiver can be in either transmitting or receiving mode. When transmitting, the switch position of the antenna switch 220 will be such that the transmitter 230 is electrically connected to the antenna 210 via the antenna switch 220, and the receiver including the zero-IF RF receiver 240 and the baseband demodulator will be turned off to save power. When in the receiving mode, the zero-IF RF receiver 240, will instead be electrically connected to the antenna 210 via the antenna switch 220 and the transmitter 230 is typically turned off in order not to interfere with the receiving operation. For this patent application, one can assume that the transceiver is in the receiving mode. The zero-IF RF receiver 240 is used for providing a first signal 242a and a second signal 243a according to the received RF signal 211. The baseband demodulator 250, which is electrically connected to the zero-IF RF receiver 240, is used for providing a third control signal 2533 to the zero-IF RF receiver 240 and a demodulated signal 2541 according to the first signal 242a and the second signal 243a. The baseband demodulator 250 comprises: a first configurable N-bit ADC 2510, a second configurable N-bit ADC 2520, a receive signal strength indicator (RSSI) and automatic gain control (AGC) unit 2530, a baseband demodulator processor 2540. The first configurable N-bit ADC 2510 is used for providing a first N-bit signal 2511 according to a first signal 242a and a first control signal 2531. The second configurable N-bit ADC 2520 is used for providing a second N-bit signal 2521 according to a second signal 243a and a second control signal 2532. The receive signal strength indicator (RSSI) and automatic gain control (AGC) unit 2530, which is electrically connected to the first configurable N-bit ADC 2510 and the second configurable N-bit ADC 2520, is used for providing the first control signal 2531, the second control signal 2532 and a third control signal 2533 according to estimated received signal strength ($P_R$) of the received RF signal 211. The baseband demodulator processor 2540, which is electrically connected to the first configurable N-bit ADC 2510 and the second configurable N-bit ADC 2520, is used for processing the first N-bit signal 2511 and the second N-bit signal 2521 and outputting a demodulated signal 2541.

The first configurable N-bit ADC 2510 further comprises: a first plurality of pipelined stage units 2510a, a first plurality of switches 2510b. The first plurality of pipelined stage units 2510a, having a signal input terminal, a control signal input terminal and a plurality of output terminals, are used for providing the first N-bit signal 2511 according to the first signal 242a and the first control signal 2531. The first plurality of switches 2510b, which are electrically connected to the first plurality of pipelined stage units are used for providing a plurality of bypass-paths for the first plurality of pipelined stage units 2510a, wherein each of the first plurality of switches 2510b are connected in parallel to each of the first plurality of pipelined stage units 2510a.

The second configurable N-bit ADC 2520 further comprises: a second plurality of pipelined stage units 2520a, a second plurality of switches 2520b. The second plurality of pipelined stage units 2520a, having a signal input terminal, a control signal input terminal and a plurality of output terminals, are used for providing the second N-bit signal 2521 according to the second signal 243a and the second control signal 2532. The second plurality of switches 2520b, which are electrically connected to the second plurality of pipelined stage units 2520a are used for providing a plurality of bypass-paths for the second plurality of pipelined stage units 2520a, wherein each of the second plurality of switches 2520b are connected in parallel to each of the second plurality of pipelined stage units 2520a. It is noted that the first N-bit signal and the second N-bit signal are not limited to be an integral bit.

The zero-IF RF receiver 240 further comprising: a first stage of low noise amplifiers (LNA) 241a, a second stage of low noise amplifiers (LNA) 241b, a first plurality of variable gain amplifiers (VGAs) 2423, a second plurality of variable gain amplifiers (VGAs) 2433. The low noise amplifiers with two stages (LNA) 241, which are electrically connected to the antenna switch 220, are used for amplifying the received RF signal 211. The first plurality of variable gain amplifiers (VGAs) 2423, which are electrically connected to the second stage of low noise amplifiers (LNA) 241b through a first mixer 2421 and a first filter 2422, are used for providing a variable gain to the I-channel signal. The second plurality of variable gain amplifiers (VGAs) 2433, which are electrically connected to the second stage of low noise amplifiers (LNA) 241b through a second mixer 2431 and a second filter 2432, are used for providing a variable gain to the Q-channel signal, wherein the third control signals 2533 consist of the ON/OFF states of the first LNA stage 241a, the second LNA stage 241b, the variable gain of the first plurality of VGAs 2423 and the second plurality of VGAs 2433, with each of the first plurality of variable gain amplifiers (VGAs) 2423 and the second plurality of variable gain amplifiers (VGAs) 2433 containing a plurality of stages, respectively.

Figure 1:
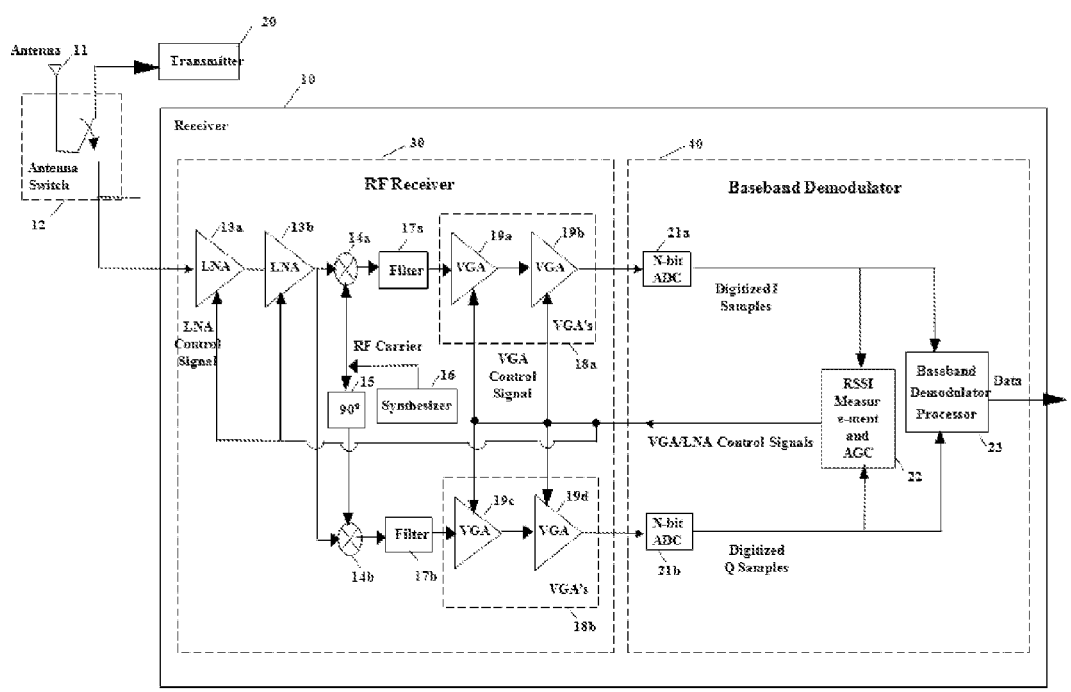
FIG. 1 shows a functional block diagram for a wireless transceiver of the prior art.
Figure 2:
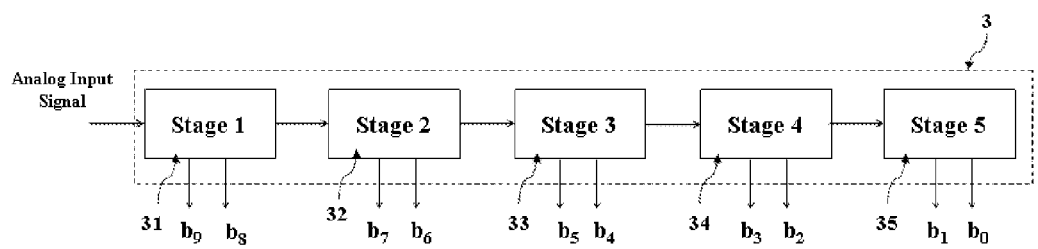
FIG. 2 shows a functional block diagram for an embodiment of a traditional 10-bit pipelined ADC of the prior art.

The difference between prior art and the present invention includes: (1) N-bit ADC's 21a/21b in FIG. 1 are replaced by the first configurable N-bit ADC 2510 and the second configurable N-bit ADC 2520 in FIG. 3, (2) the receive signal strength indicator (RSSI) and automatic gain control (AGC) unit 2530 in FIG. 3 has to generate the first control signal 2531, the second control signal 2532 and a third control signal 2533. The RF front-end of wireless communication receiver has a few LNA and VGA stages to amplify the input signal, the first configurable N-bit ADC 2510 and the second configurable N-bit ADC 2520 to convert the first signal 242a and the second signal 243a into a first N-bit (or less bits) signal 2521 and the second N-bit (or less bit) signal 2522, and typically a digital receive signal strength indicator (RSSI) measurement and AGC 2530 estimates the received signal strength ($P_R$) and determines (1) the gain settings for a first plurality of variable gain amplifiers (VGAs) 2423 and a second plurality of variable gain amplifiers (VGAs) 2433 and (2) the ON/OFF states for the first stage of low noise amplifiers (LNA) 241a and the second stage of low noise amplifiers (LNA) 241b in order to maintain an appropriate signal power level into the first configurable N-bit ADC 2510 and the second configurable N-bit ADC 2520. On a per packet basis, the first configurable N-bit ADC 2510 and the second configurable N-bit ADC 2520 can be adaptively configured so its output bits can be reduced from an integer N to a smaller integer M (N>M>0) when the estimated received power of strength ($P_R$) is larger than a pre-set threshold, $RSSI_{TH}$. The reason behind using the received signal strength ($P_R$) as the basis for the first configurable N-bit ADC 2510 and the second configurable N-bit ADC 2520 output bit reduction is: when the received signal strength is so strong that it requires one of the first stage of low noise amplifiers (LNA) 241a and the second stage of low noise amplifiers (LNA) 241b to be switched off, it is expected that the received RF signal 211 is less vulnerable to both multipath fading and adjacent channel interferences.

Although for any estimated received signal strength ($P_R$) greater than a certain value, it is feasible to configure both of the first configurable N-bit ADC 2510 and the second configurable N-bit ADC 2520 to M-bit (M<N) ADC's, the values of $RSSI_{TH}$ will, as proposed in this patent application, be conveniently selected to coincide with either the first stage of low noise amplifiers (LNA) 241a or the second stage of low noise amplifiers (LNA) 241b being switched off. In other words, when the third control signal 2533 requests the first stage of low noise amplifiers (LNA) 241a or the second stage of low noise amplifiers (LNA) 241b being switched off, both of the first control signal 242a and the second control signal 243a will then consider requesting the first configurable N-bit ADC 2510 and the second configurable N-bit ADC 2520 to output M bits at the same time. As explained in previous text, we are taking advantage of the fact that the ADC switching time $T_{ADC}$ is much less than the first stage of low noise amplifiers (LNA) 241a or the second stage of low noise amplifiers (LNA) 241b switching time $T_{LNA}$.

To further understand the spirit of the present invention, a method used for saving power in the wireless communication receiver RF front-end, comprising steps of: step1: receiving a received RF signal 211 from an antenna 210 through proper switch setting of the antenna switch 220 to a zero-IF RF receiver 240, step2: estimating the received signal strength ($P_R$) of the received RF signal 211 by using a receive signal strength indicator (RSSI) and automatic gain control (AGC) unit 2530 located in a baseband modulator 250, comparing the estimated received signal strength ($P_R$) with a receive signal strength indicator thresholds value ($RSSI_{TH}$) to generate a first control signal 2531 and a second control signal 2532 and using estimated received signal strength ($P_R$) to determine a third control signal 2533, step3: providing a first control signal 2531 to control a first configurable N-bit ADC 2510 in the baseband modulator 250 and a second control signal 2532 to control a second configurable N-bit ADC 2520 in the baseband modulator 250, and at the same time, providing a third control signal 2533 which contains the ON/OFF states of the first stage of LNA 241a and the second stage of LNA 241b, a gain of a first plurality of VGAs 2423 and a gain of a second plurality of VGAs 2433. While in step3, when the third control signal 2533 requests one of the LNA stages 241a or 241b being switched off, to provide a first signal to the first configurable N-bit ADC 2510 in the baseband modulator 250 and the second control signal to a second configurable N-bit ADC 2520 in the baseband modulator 250, if so desired, to configure both of the configurable N-bit ADC 2510 and the second configurable N-bit ADC 2520 from N bit to M-bit with M<N.

Figure 6:
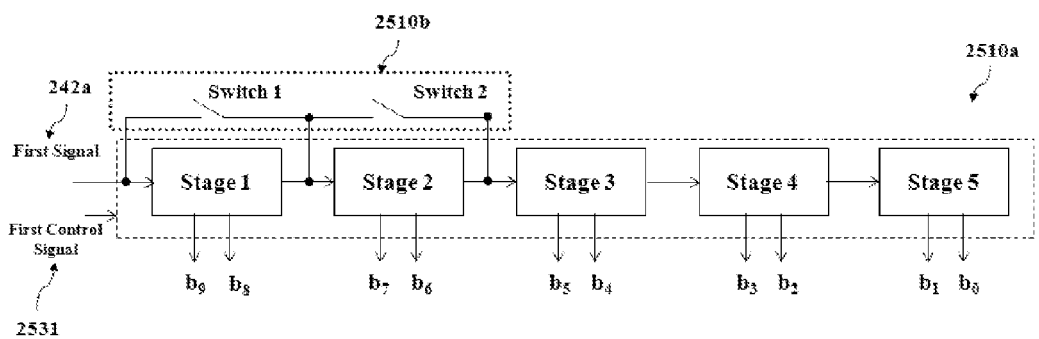
FIG. 6 shows a functional block diagram for the first embodiment of a first configurable 10-bit ADC of the present invention.

FIG. 6 shows the embodiment of the first configurable 10-bit ADC. One can consider it as an N=10 pipelined ADC implementation for the first configurable N-bit ADC 2510 and the second configurable N-bit ADC 2520. This specific ADC implementation has 5 Stages and an additional couple of Switches (Switch 1 and Switch 2 in FIG. 6). With each stage serving to output 2 bits, a first signal 242a is digitalized to a 10-bit output sample: (b9, b8, b7, b6, b5, b4, b3, b2, b1, b0), with b9 being the most significant bit, and b0 being the least significant bit. Note also here Stages 1 and 2 will be independently turned off (to save power) while the rest of the ADC circuitry remains "on" based on the first control signals 2531. Before detecting a packet, this Configurable 10-bit Pipelined ADC has (1) Stages 1 and 2 both with a default setting "on" and (2) Switches 1 and 2 both with the same default setting "open", so it convert a first signal 242a to a 10-bit output. When the receive signal strength indicator (RSSI) and automatic gain control (AGC) unit 2530 sends a third control signal 2533 to have one of the low noise amplifiers (LNA) stages 241a or 241b turned off, at the same time it sends both the first control signal and the second control signal to both the first configurable N-bit ADC 2510 and the second configurable N-bit ADC 2520. With a first configurable 10-bit ADC shown in FIG. 6, the first control signal 2531 can be used to close the Switch 1 (and/or Switch 2) and turn off its Stage 1 (and/or Stage 2) at the same time. When only Stage 1 is turned off in both ADC's 2510 and 2520, each ADC will output 8-bit: (b7, b6, b5, b4, b3, b2, b1, b0), with b7 being the most significant bit.

The functions and the advantages of the present invention have been shown. Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A power-saving apparatus for a wireless communication baseband demodulator comprising:
   a first configurable N-bit analog-to-digital converter (ADC), for providing a first N-bit signal according to a first signal and a first control signal;
   a second configurable N-bit ADC, for providing a second N-bit signal according to a second signal and a second control signal;
   a receive signal strength indicator (RSSI) and automatic gain control (AGC) unit, electrically connected to the first configurable N-bit ADC and the second configurable N-bit ADC, for providing the first control signal, the second control signal and a third control signal according to an estimated received signal strength ($P_R$); and a baseband demodulator processor, electrically connected to the first configurable N-bit ADC and the second configurable N-bit ADC, for processing the first N-bit signal and the second N-bit signal and outputting a demodulated signal.

2. The power-saving apparatus as claimed in claim 1, wherein the first configurable N-bit ADC further comprises:
   a first plurality of pipelined stage units, having a signal input terminal, a control signal input terminal and a plurality of output terminals, for providing the first N-bit signal according to the first signal and the first control signal;
   a first plurality of switches, electrically connected to the first plurality of pipelined stage units, for providing a plurality of bypass-paths for the first plurality of pipelined stage units; and
   wherein each of the first plurality of switches are connected in parallel to each of the first plurality of pipelined stage units.

3. The power-saving apparatus as claimed in claim 1, wherein the second configurable N-bit ADC further comprises:
   a second plurality of pipelined stage units, having a signal input terminal, a control signal input terminal and a plurality of output terminals, for providing the second N-bit signal according to the second signal and the second control signal;
   a second plurality of switches, electrically connected to the second plurality of pipelined stage units, for providing a plurality of bypass-paths for the second plurality of pipelined stage units; and
   wherein each of the second plurality of switches are connected in parallel to each of the second plurality of pipelined stage units.

4. A power-saving transceiver for wireless communication system, comprising:
   an antenna, for receiving and transmitting a Radio Frequency (RF) signal;
   an antenna switch, electrically connected to the antenna and a transmitter;
   a zero-Intermediate-Frequency (zero-IF) RF receiver, electrically connected to the antenna switch, for providing a first signal and a second signal according to the RF signal received from the antenna;
   a baseband demodulator, electrically connected to the zero-IF RF receiver, for providing a third control signal to the zero-IF RF receiver and a demodulated signal according to the first signal and the second signal; and
   wherein the baseband demodulator comprises:
   a first configurable N-bit ADC, for providing a first N-bit signal according to the first signal and a first control signal;
   a second configurable N-bit ADC, for providing a second N-bit signal according to the second signal and a second control signal;
   a receive signal strength indicator (RSSI) and automatic gain control (AGC) unit, electrically connected to the first configurable N-bit ADC and the second configurable N-bit ADC, for providing the first control signal, the second control signal and a third control signal according to an estimated received signal strength ($P_R$); and
   a baseband demodulator processor, electrically connected to the first configurable N-bit ADC and the second configurable N-bit ADC, for processing the first N-bit signal and the second N-bit signal and outputting a demodulated signal.

5. The wireless communication system with power-saving as claimed in claim 4, wherein the first configurable N-bit ADC further comprises:
   a first plurality of pipelined stage units, having a signal input terminal, a control signal input terminal and a plurality of output terminals, for providing the first N-bit signal according to the first signal and the first control signal;
   a first plurality of switches, electrically connected to the first plurality of pipelined stage units, for providing a plurality of bypass-paths for the first plurality of pipelined stage units; and
   wherein each of the first plurality of switches are connected in parallel to each of the first plurality of pipelined stage units.

6. The wireless communication system with power-saving as claimed in claim 4, wherein the second configurable N-bit ADC further comprises:
   a second plurality of pipelined stage units, having a signal input terminal, a control signal input terminal and a plurality of output terminals, for providing the second N-bit signal according to the second signal and the second control signal;
   a second plurality of switches, electrically connected to the second plurality of pipelined stage units, for providing a plurality of bypass-paths for the second plurality of pipelined stage units; and
   wherein each of the second plurality of switches are connected in parallel to each of the second plurality of pipelined stage units.

7. The wireless communication system with power-saving as claimed in claim 4, wherein the zero-IF RF receiver further comprising:
   a first stage of low noise amplifiers (LNA), electrically connected to the antenna switch, for amplifying the received RF signal;
   a second stage of low noise amplifiers (LNA), electrically connected to the first stage of low noise amplifiers (LNA), for amplifying the received RF signal;
   a first plurality of variable gain amplifiers (VGAs), electrically connected to the second stage of low noise amplifiers (LNA) through a first mixer and a first filter, for providing a variable gain to a I-channel signal;
   a second plurality of variable gain amplifiers (VGAs), electrically connected to the second stage of low noise amplifiers (LNA) through a second mixer and a second filter, for providing a variable gain to a Q-channel signal; and
   wherein the third control signal consists of an ON/OFF states of the first stage of low noise amplifiers (LNA) and the second stage of low noise amplifiers (LNA), and the variable gain of the first plurality of variable gain amplifiers (VGAs) and the second plurality of variable gain amplifiers (VGAs), with each of the first plurality of variable gain amplifiers (VGAs) and the second plurality of variable gain amplifiers (VGAs) containing a plurality of stages, respectively.

8. A method for saving power in a wireless communication receiver, comprising steps of:
   receiving a Radio Frequency (RF) signal from an antenna to a zero-Intermediate-Frequency (zero-IF) RF receiver according to an antenna switch;

estimating an estimated received signal strength ($P_R$) of the RF signal from a receive signal strength indicator (RSSI) and automatic gain control (AGC) unit located in a baseband demodulator;

comparing the estimated received signal strength ($P_R$) with a receive signal strength indicator thresholds value ($RSSI_{TH}$) to generate a first control signal and a second control signal; providing a third control signal based on the estimated received signal strength ($P_R$), with the first control signal to control a first configurable N-bit analog-to-digital converter (ADC) in the baseband demodulator and the second control signal to control a second configurable N-bit ADC in the baseband demodulator, and the third control signals consisting of an ON/OFF states of a first stage of low noise amplifiers (LNA) and a second stage of low noise amplifiers (LNA), a gain of a first plurality of variable gain amplifiers (VGAs) and a gain of a second plurality of variable gain amplifiers (VGAs).

9. The method for saving power in the wireless communication receiver as claimed in claim 8, wherein the baseband demodulator comprises:

a first configurable N-bit ADC, for providing a first N-bit signal according to a first signal and a first control signal;

a second configurable N-bit ADC, for providing a second N-bit signal according to a second signal and a second control signal;

a receive signal strength indicator (RSSI) and automatic gain control (AGC) unit, electrically connected to the first configurable N-bit ADC and the second configurable N-bit ADC, for providing the first control signal, the second control signal and a third control signal according to the estimated received signal strength ($P_R$) of the RF signal; and a baseband demodulator processor, electrically connected to the first configurable N-bit ADC and the second configurable N-bit ADC, for processing the first N-bit signal and the second N-bit signal and outputting a demodulated signal.

10. The method for saving power in the wireless communication receiver as claimed in claim 8, wherein the first configurable N-bit ADC further comprises:

a first plurality of pipelined stage units, having a signal input terminal, a control signal input terminal and a plurality of output terminals, for providing the first N-bit signal according to the first signal and the first control signal;

a first plurality of switches, electrically connected to the first plurality of pipelined stage units, for providing a plurality of bypass-paths for the first plurality of pipelined stage units; and wherein each of the first plurality of switches are connected in parallel to each of the first plurality of pipelined stage units.

11. The method for saving power in the wireless communication receiver as claimed in claim 8, wherein the second configurable N-bit ADC further comprises:

a second plurality of pipelined stage units, having a signal input terminal, a control signal input terminal and a plurality of output terminals, for providing the second N-bit signal according to the second signal and the second control signal;

a second plurality of switches, electrically connected to the second plurality of pipelined stage units, for providing a plurality of bypass-paths for the second plurality of pipelined stage units; and wherein each of the second plurality of switches are connected in parallel to each of the second plurality of pipelined stage units.

* * * * *